United States Patent
Kang

(10) Patent No.: US 7,550,835 B2
(45) Date of Patent: Jun. 23, 2009

(54) CHIP STACK PACKAGE UTILIZING A DUMMY PATTERN DIE BETWEEN STACKED CHIPS FOR REDUCING PACKAGE SIZE

(75) Inventor: Tae Min Kang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 544 days.

(21) Appl. No.: 11/485,495

(22) Filed: Jul. 12, 2006

(65) Prior Publication Data
US 2007/0228579 A1 Oct. 4, 2007

(30) Foreign Application Priority Data
Mar. 29, 2006 (KR) .................... 10-2006-0028524

(51) Int. Cl.
*H01L 23/02* (2006.01)
*H01L 23/52* (2006.01)

(52) U.S. Cl. ................ 257/686; 257/774; 257/777; 257/780; 257/E23.011

(58) Field of Classification Search .......... 257/686, 257/777, 774, 780, E23.141
See application file for complete search history.

(56) References Cited

U.S. PATENT DOCUMENTS

| | | | |
|---|---|---|---|
| 5,128,831 A * | 7/1992 | Fox et al. ................ 361/735 |
| 6,335,535 B1 * | 1/2002 | Miyake et al. ......... 250/492.21 |
| 6,972,481 B2 * | 12/2005 | Karnezos ..................... 257/686 |
| 7,138,722 B2 * | 11/2006 | Miyamoto et al. .......... 257/777 |
| 7,335,592 B2 * | 2/2008 | Kim et al. .................... 438/667 |
| 2004/0119153 A1 * | 6/2004 | Karnezos ..................... 257/686 |
| 2005/0199992 A1 * | 9/2005 | Baek et al. .................. 257/686 |
| 2006/0151865 A1 * | 7/2006 | Han et al. .................... 257/686 |
| 2007/0018299 A1 * | 1/2007 | Koo et al. .................... 257/686 |

FOREIGN PATENT DOCUMENTS

| KR | 1020010004527 | 1/2001 |
|---|---|---|
| KR | 1020060029715 | 4/2006 |

\* cited by examiner

*Primary Examiner*—Nitin Parekh
(74) *Attorney, Agent, or Firm*—Ladas & Parry LLP

(57) ABSTRACT

The chip stack package includes at least a printed circuit board having a bond finger and a ball land, and at least two semiconductor chips stacked on the printed circuit board while being spaced from each other and formed with a plurality of bonding pads. A dummy pattern die is attached to the upper surface of each semiconductor chip. The dummy pattern die is formed with a circuit pattern on its lower surface for electrical connection to the semiconductor chip. The dummy pattern is also formed with a via pattern on its upper side which is connected to the circuit pattern. The first solder balls electrically connects the bond finger with the circuit pattern while electrically connecting the via pattern of stacked dummy pattern dies with the circuit pattern. The second solder balls are attached to the ball land of the printed circuit board.

5 Claims, 7 Drawing Sheets

CHIP STACK PACKAGE UTILIZING A DUMMY PATTERN DIE BETWEEN STACKED CHIPS FOR REDUCING PACKAGE SIZE

BACKGROUND OF THE INVENTION

1. Field of the Invention

The present invention relates generally to a chip stack package. More particularly, the present invention relates to a chip stack package using a dummy pattern die.

2. Description of the Prior Art

As generally known in the art, the semiconductor packaging technologies have been focusing on ways to mount a greater number of chips or packages on a package substrate having a predetermined size that have also been reduced over time. In addition, recently, as the size of the package becomes reduced, the studies have been actively performed in relation to a chip stack package capable of mounting two to four semiconductor chips on one package.

Currently available packaging techniques are the FBGA package, the MCP (multi chip package), and the DDP (double die package), all of which make an electrical interconnection between a chip and a substrate by using a wire bonding. However, in such a package, the bonding pads 1a, 2a and 3a (now referring to FIG. 1, which is a top view showing the stacked chips 1, 2, and 3 without the substrate 6 shown in FIG. 2) extend in one direction on top of each respective stacked chip 1, 2, or 3, such that the number of bonding wires 4 is increased. For this reason, as shown in FIG. 2, the bonding wires 4 run in the horizontal and/or the vertical direction in order to prevent the stacked chips 1, 2, and 3 from interfering with each other during the wire bonding process; however, this causes the size of a substrate 6 to become enlarged. Enlarged size of the substrate 6 will increase the overall size of the package. Each bonding wire is connected between two boding fingers 7, and any two stacked chips 1, 2, or 3 are joined with adhesive 5.

FIG. 3 shows the prior art solution to the above-discussed prior art problem, which proposes a method of making an electrical interconnection between the semiconductor chips 1, 2, and 3 and the substrate 6 by using a metal film tape 10, instead of using the wire bonding (such as FIG. 2, elements 4). However, when the metal film tape 10 is drawn in one direction, extra space is necessary in order to prevent the semiconductor chips 1, 2, and 3 from interfering with each other. Thus, even in the case of the prior art solution as shown in FIG. 3, the length of the metal film tape 10 must be increased, so that the size of the package is also enlarged.

SUMMARY OF THE INVENTION

Accordingly, the present invention has been made to solve the above-mentioned and other problems occurring in the prior art, and one of many objects of the present invention is to provide a chip stack package designed to accommodate semiconductor chips therein without increasing the size thereof.

In order to accomplish this object, there is provided a chip stack package comprising: a printed circuit board formed on an upper surface thereof with a bond finger and on a lower surface thereof with a ball land; at least two face-up type semiconductor chips stacked on the printed circuit board while being spaced from each other and formed with a plurality of bonding pads; a dummy pattern die attached to an upper surface of each semiconductor chip, formed on a lower surface thereof with a circuit pattern electrically connected to the semiconductor chip, and formed at an inner peripheral portion thereof with a via pattern connected to the circuit pattern; first solder balls for electrically connecting the bond finger of the printed circuit board with the circuit pattern of the dummy pattern die while electrically connecting the via pattern of stacked dummy pattern dies with the circuit pattern; and second solder balls attached to the ball land of the printed circuit board.

According to the preferred embodiment of the present invention, the chip stack package further comprises a bump interposed between the semiconductor chip and the dummy pattern die so as to electrically and mechanically connect the semiconductor chip with the dummy pattern die.

The dummy pattern die is attached to both lateral sides of the semiconductor chip, except for a center portion of the semiconductor chip. In this case, the chip stack package according to the present invention further comprises a gap-fill material filled in spaces formed between the semiconductor chip and the dummy pattern die and between dummy pattern dies, respectively.

The semiconductor chip is formed with a redistribution layer connected to the bonding pad.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
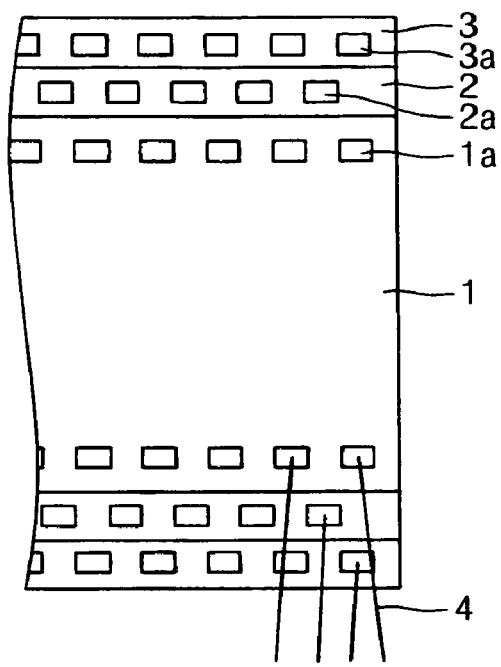
FIG. 1 shows a top view of stacked chips and the layout of the bonding pads on each stacked chips to illustrate the problems of the conventional chip stack packages.

Hereinafter, a preferred embodiment of the present invention will be described with reference to the accompanying drawings. In the following description and drawings, the same reference numerals may be used to designate the same or similar components, so that the repetition of the description on the same or similar components will be omitted.

Figure 2:
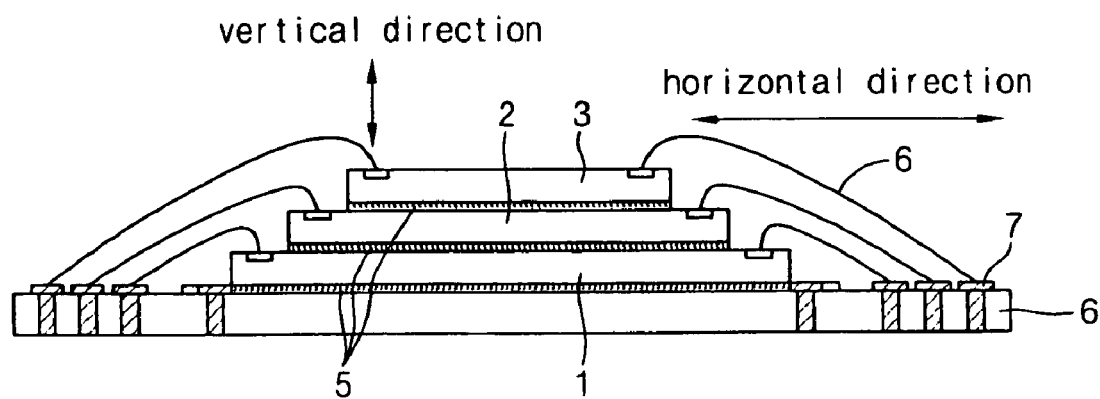
FIG. 2 shows a cross-sectional side view of the stacked chips as shown in FIG. 1 to illustrate the problems of the conventional chip stacked packages.
Figure 3:
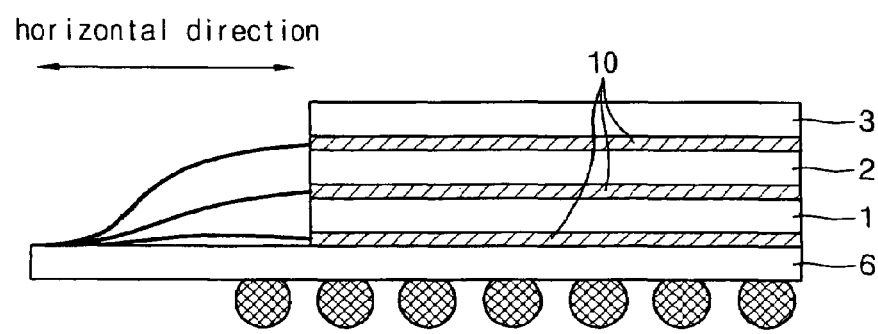
FIG. 3 shows a cross-sectional side view of the stacked chips, which provides conventional prior art solution to the prior art problems shown with respect to FIGS. 1 and 2.

At the outset, the technical principle of the present invention is briefly described. According to the present invention, the electrical interconnection between stacked chips and a substrate is achieved by means of a dummy pattern die (such as that shown in FIGS. 4E, 5, 7), instead of a conventional wire bonding (such as FIG. 2, elements 4) or a conventional metal pattern tape (such as FIG. 3, elements 10). FIG. 4E shows the dummy pattern die 60 made according to an embodiment of the present invention, which includes a via pattern 45 and a upper wiring 49 formed on a bare wafer 40.

The dummy pattern die 60 (FIG. 4E) is fabricated by the following procedure.

Figure 4A:
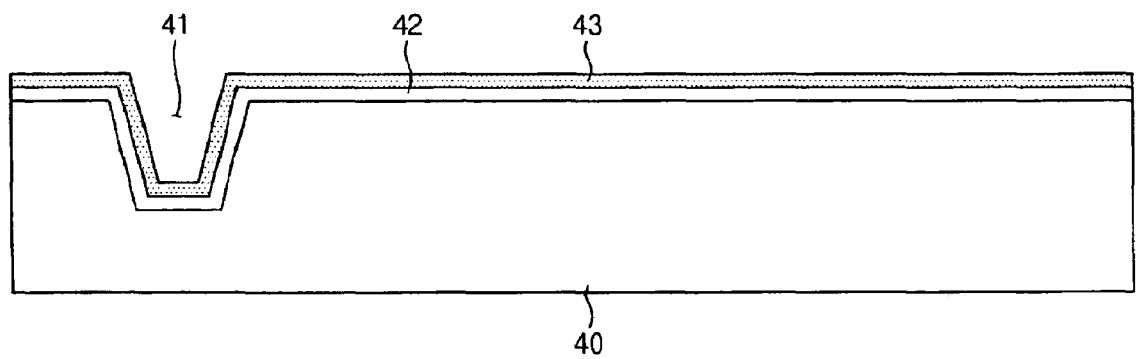
FIGS. 4A through 4E are cross-sectional views illustrating the procedure for manufacturing a dummy pattern die used for a chip stack package according to one embodiment of the present invention.

First, as shown in FIG. 4A, after preparing the bare wafer 40, a via etching process is performed with respect to the bare wafer 40, thereby forming a groove 41 on a predetermined portion of an upper surface of the bare wafer 40. Then, a first insulating layer 42 including $SiO_2$ and a first seed metal layer 43 are sequentially deposited on the bare wafer 40 formed with the groove 41.

After that, a photoresist film (not shown) is coated on the bare wafer 40 on which the layers 42, 43 are formed, and an exposure and development process is performed such that the photoresist film is filled only in the groove 41 while exposing the first seed metal layer 43 outside the groove 41. Then, the first seed metal layer 43 formed on the upper surface of the bare wafer 40 is removed by using the photoresist film (not shown) as an etching barrier, and then the photoresist film is removed, and the resultant structure as shown in FIG. 4B.

Figure 4B:
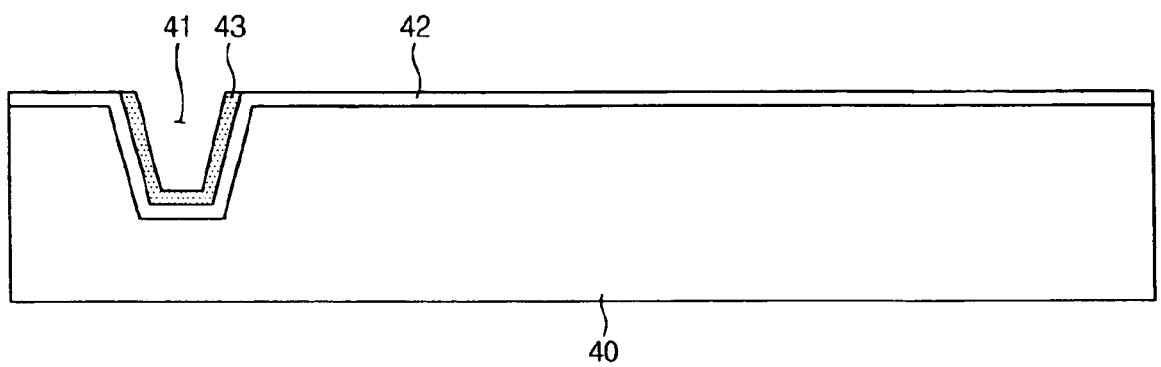

Next, an electroplating process is performed with respect to the resultant structure of FIG. 4B so as to form a plating layer 44 (see FIG. 4C inside the groove 41) on the bottom and sidewall surfaces of the first seed metal layer 43 remaining in the groove 41.

Figure 4C:
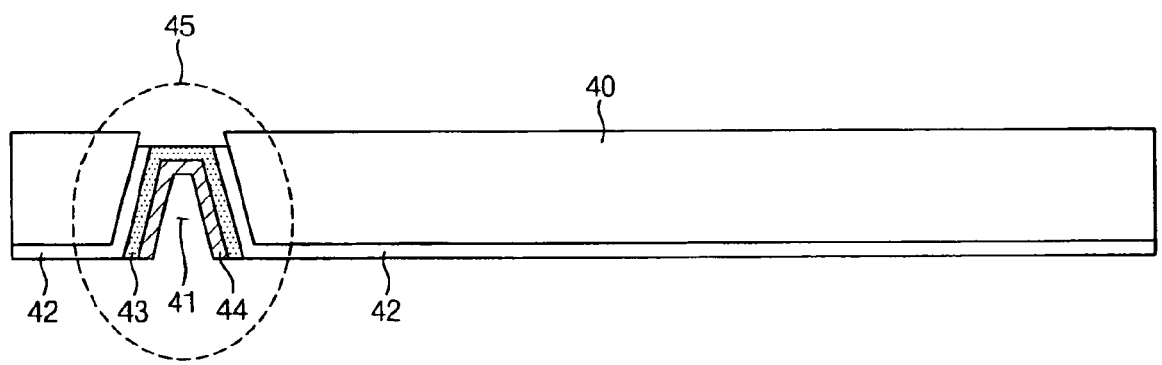

After that, now referring to FIG. 4C, the structure is turned over, and a back-grinding process is performed on the portion of the rear surface of the bare wafer 40 corresponding to the bottom surface of the groove 41 until the first insulating layer 42 formed on the bottom of the groove 41 is exposed. Then, the exposed first insulating layer 42 is removed, thereby forming a via pattern 45. Herein, although it is illustrated in FIG. 4C in according with an embodiment of the present invention that the via pattern 45 is formed with a hollow groove 41, it is also possible to fill the groove 41.

Figure 4D:
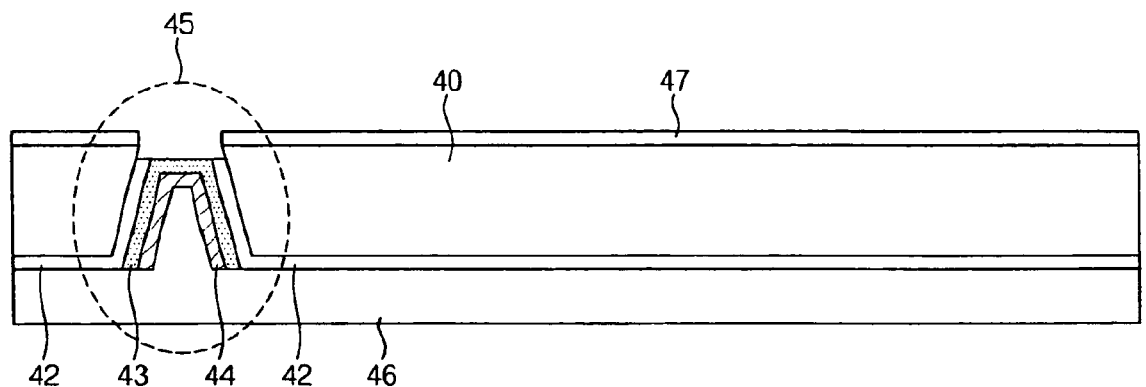
Figure 4E:
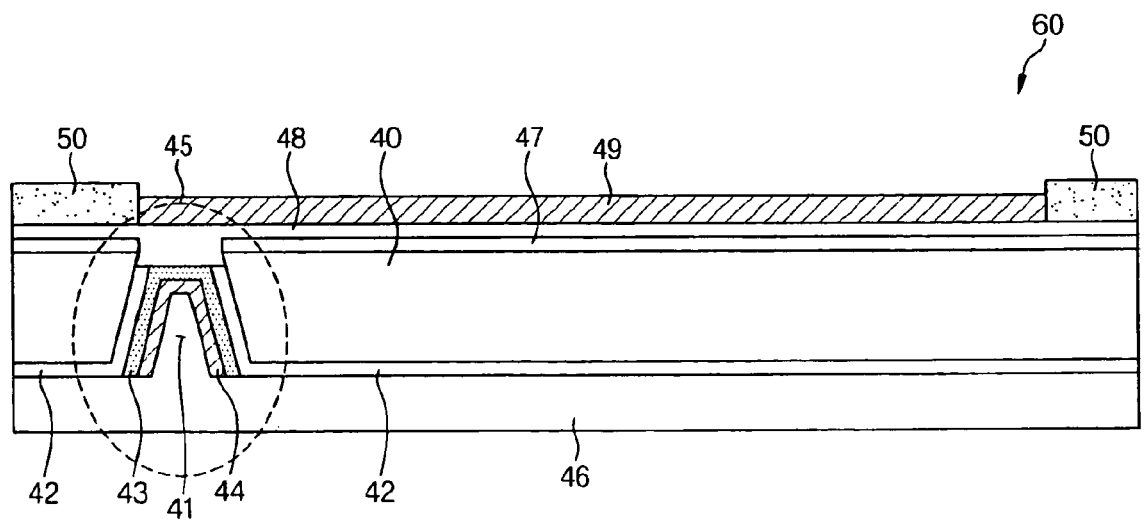

Then, the upside down structure of FIG. 4D is again turned over so that the upper surface of the bare wafer 40 having the hollow side of the groove 41 is now positioned to be the top surface of the structure. A glass metal 46 (see FIG. 4E) is then formed on the upper surface of the bare wafer 40 having the hollow side of the groove 41. Then, the resultant structure is again turned over such that the upper surface of the bare wafer 40 having the hollow side of the groove 41 with the glass material 46 formed thereon is now facing bottom as this is shown in FIG. 4E. A second insulating layer 47 is then deposited on the rear surface of the bare wafer 40. Then, the second insulating layer 47 is etched to expose the via pattern 45 from the rear surface of the bare wafer 40.

After that, as shown in FIG. 4E, a second seed metal layer 48 is formed on the second insulating layer 47 as well as on the exposed via pattern 45. Then, a typical photolithography process is performed in order to form a photoresist film pattern (not shown) on an upper surface of the second seed metal layer 48. The photoresist pattern defines a region on which a circuit pattern, such as a copper wiring, is to be formed on the surface of the second seed metal layer 48. In addition, a copper layer 49 is formed by a plating process on the exposed second seed metal layer 48, thereby forming the circuit pattern electrically connected to the via pattern 45. Thereafter, the photoresist film pattern (not shown) and the second seed metal layer 48 formed below the photoresist film pattern (not shown) are removed, and a solder-resist 50 is coated on the second seed metal layer layer 48 including the copper wiring 49. Then, the solder-resist 50 is patterned in such a manner that a portion of the copper wiring 49, which serves as an electrical contact, is exposed, thereby obtaining the dummy pattern die 60 as shown in FIG. 4E.

The present invention provides a chip stack package using the dummy pattern die described above with respect to an embodiment of the present invention. Thus, quite differently from the prior art structures that use the wire bonding or the metal film tape requiring extra space to prevent the stacked chips from interfering with each other, no such extra space is required by the present invention, so that it is not necessary to enlarge the size of the substrate and the package.

Figure 5:
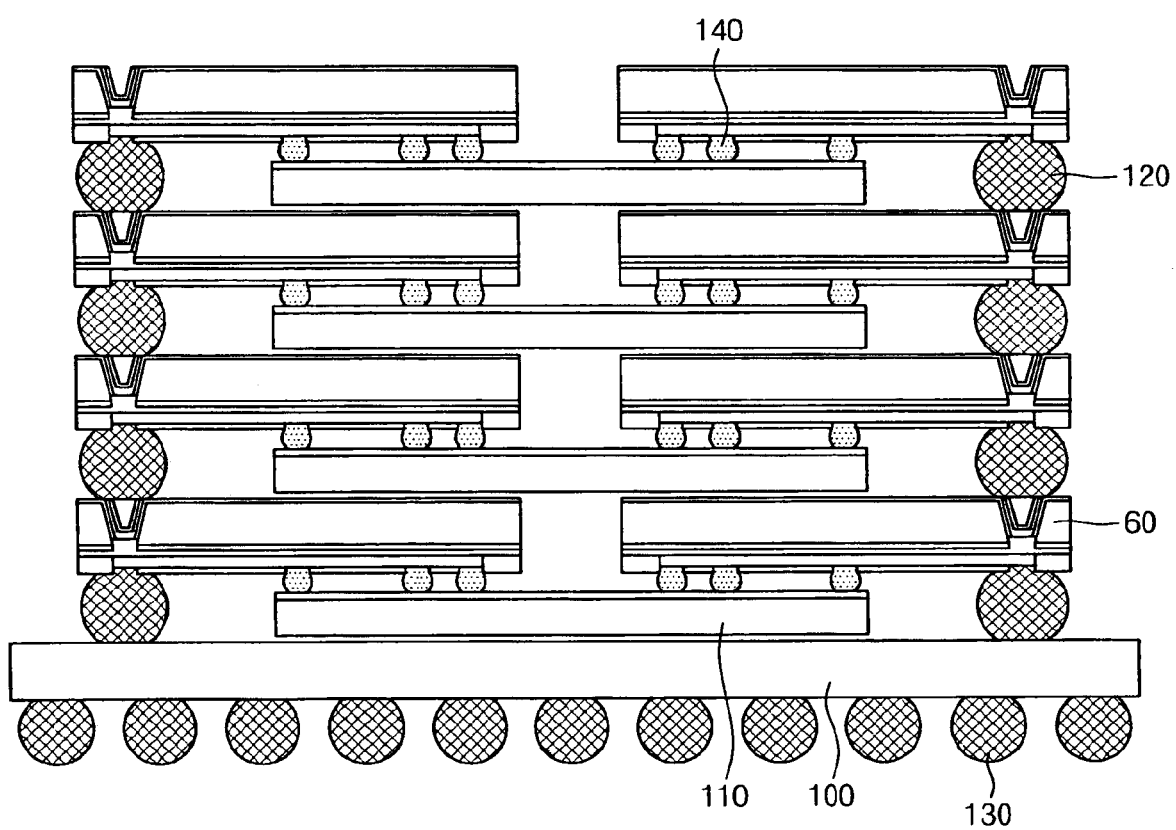
FIG. 5 is a cross-sectional view of a chip stack package according to one embodiment of the present invention.

FIG. 5 is a cross-sectional view of the chip stack package according to one embodiment of the present invention.

The chip stack package according to an embodiment of the present invention includes:

(1) a printed circuit board 100 having a bond finger (not shown) on its upper surface and having a ball land (not shown) on its lower surface;

(2) at least two semiconductor chips 110, for example, four semiconductor chips 110 stacked on the printed circuit board 100 by using the dummy pattern die 60;

(3) first solder balls 120, one of which electrically connects the circuit pattern of the lowest dummy pattern die 60 (that is, the copper wiring 49) and the bond finger (not shown) formed on the printed circuit board 100, and each of the other first solder balls 120 also electrically connects the copper wirings 49 of the stacked dummy pattern dies 60 to the via pattern 45 of the dummy pattern 60 stacked below; and (4) a plurality of second solder balls 130 attached to the ball lands of the printed circuit board 100.

Although it is not shown in FIG. 5, it will be apparent to those skilled in the pertinent art that the printed circuit board 100 is formed on the upper surface thereof with a circuit pattern including the bond finger and is formed on the lower surface thereof with the ball land, which is connected to the circuit pattern and to which the second solder balls 120 are attached.

For example, the semiconductor chip 110 as shown in FIG. 5 could be a center pad type chip, which is formed on the center of an upper surface thereof with bonding pads. In addition, a redistribution layer could be formed on the upper surface of the semiconductor chip 110 by performing a redistribution process such that the redistribution layer can be connected to the bonding pads.

The dummy pattern dies 60 are attached to predetermined surfaces of the semiconductor chips 110, where the bonding pads are formed, by means of bumps 140. Accordingly, the semiconductor chip 110 is electrically and mechanically connected with the dummy pattern die 60 through the bump 140.

Components of the above chip stack package described according to an embodiment of the present invention are electrically interconnected by means of the dummy pattern dies. In particular, since stacked semiconductor chips are electrically connected to each other by means of the dummy pattern dies, the extra space is not necessary to prevent the wirings of the stacked semiconductor chips from interfering. Accordingly, it is not necessary to enlarge the size of the substrate and consequently the size of the package. In addition, the chip stack package according to an embodiment of the present invention has an empty space between the dummy pattern dies, so that heat generated during the operation of the semiconductor chip can be emitted to the exterior through the empty space. Thus, it is possible to prevent defects from being caused by heat.

Meanwhile, the following processes may form a part of fabricating the chip stack package according to an embodiment of the present invention.

Figure 6A:
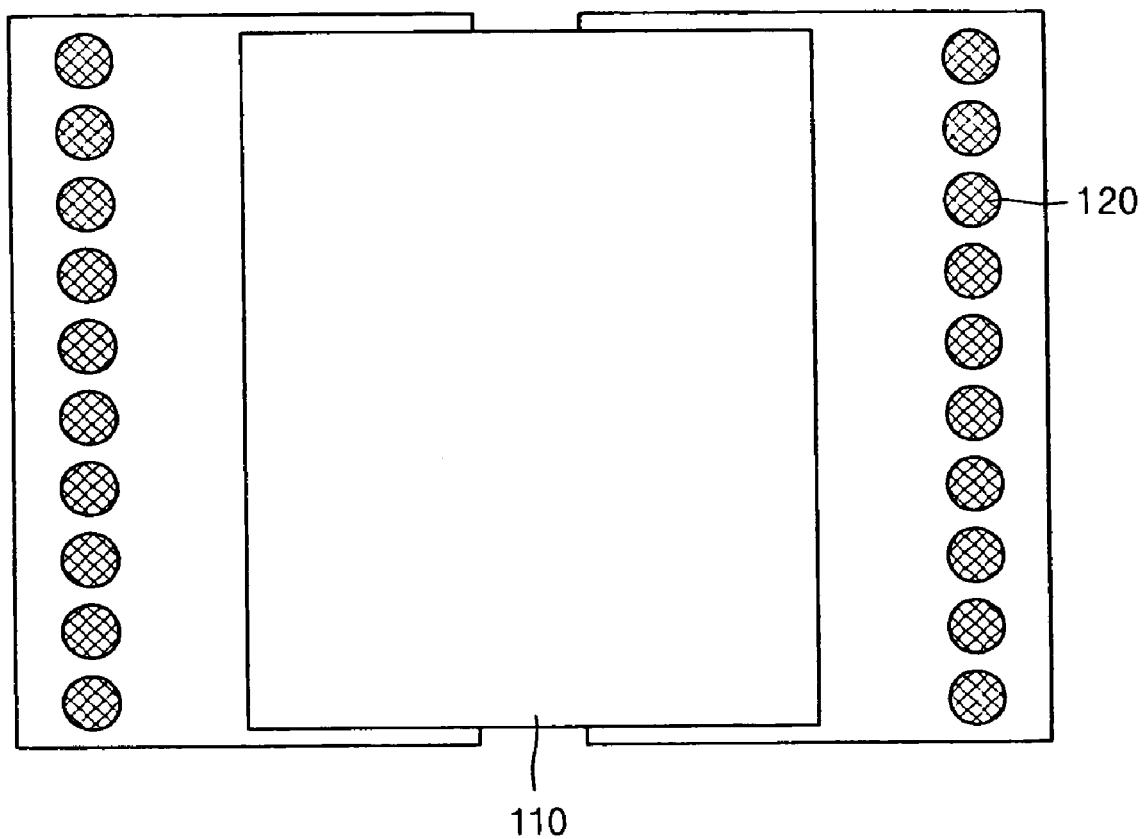
FIGS. 6A and 6B are top and cross-sectional side views, respectively, for illustrating the procedure for manufacturing a chip stack package according to one embodiment of the present invention.

First, as shown in FIG. 6A, after preparing the semiconductor chip 110 formed with the redistribution layer, the dummy pattern die 60 is attached to the semiconductor chip 110 by using the bump (not shown). After that, the first solder balls 120 are attached to the via pattern 45 of the dummy pattern die 60. At this time, the dummy pattern die 60 is attached to both lateral sides of the semiconductor chip 110 except for the center portion of the semiconductor chip 110. Thus, as mentioned above, heat generated during the operation of the semiconductor chip in the semiconductor package can be emitted to the exterior through the empty space formed between the dummy pattern dies 60.

Figure 6B:
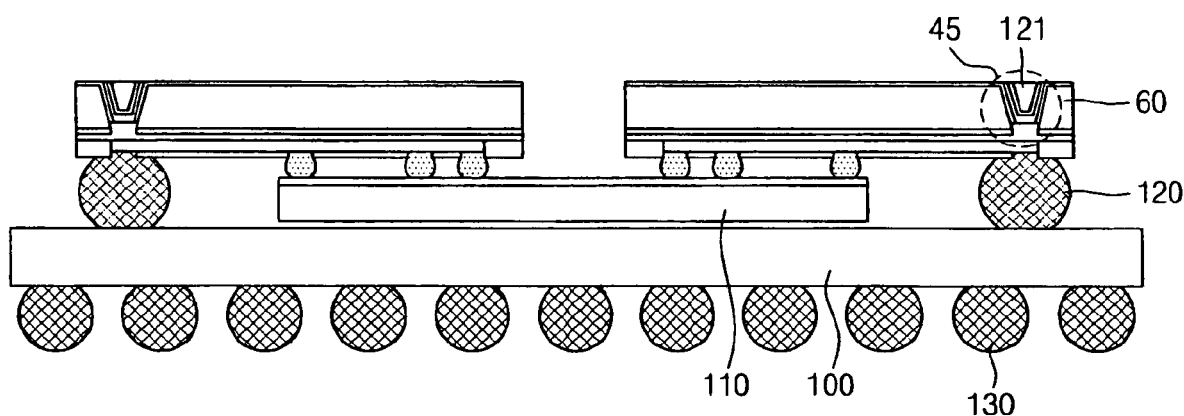

Next, as shown in FIG. 6B, in a state in which a solder paste 121 is filled in the groove of the via pattern 45, the resultant structure is attached to the printed circuit board 100.

After that, as shown in FIG. 5, a desired number of structures, which are identical to the structure attached to the printed circuit board 100, are continuously stacked on the structure by using the first solder balls 120. Finally, the curing process is performed, thereby obtaining the chip stack package according to an embodiment of the present invention.

Figure 7:
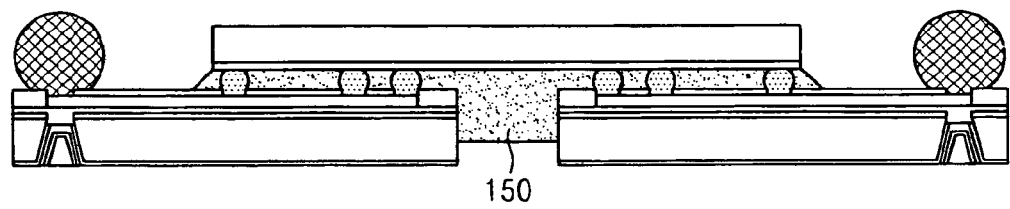
FIG. 7 is a cross-sectional side view illustrating a chip stack package according to another embodiment of the present invention, in which a space formed between a semiconductor chip and a double pattern die is filled with gap-fill materials.

Meanwhile, although it has been described that the empty space is formed between dummy pattern dies for the purpose of heat emission, it is also possible to fill the empty space formed between dummy pattern dies 60 and the space formed between the dummy pattern die 60 and the semiconductor chip 110 with gap-fill materials 150 as this is shown in FIG. 7.

As described above, according to various embodiments of the present invention, the semiconductor chips are stacked using the dummy pattern dies, so that it is not necessary to enlarge the size of the substrate and consequently the package, even if the number of the stacked semiconductor chips is increased. Thus, the present invention can provide the chip stack package having high capacity and proper chip size.

In addition, according to various embodiments of the present invention, the empty space is formed between the printed circuit board and the dummy pattern die and between the dummy pattern dies, so that heat can be easily emitted to the exterior. Thus, reliability of the product can be improved.

Furthermore, since the dummy pattern die used in various embodiments of the present invention can be fabricated by using a wafer, the heat expansion coefficient of the semiconductor chip is identical to that of the dummy pattern die, so that warpage of the semiconductor chip can be prevented.

Although the embodiments including preferred one of the present invention have been described for illustrative purposes, those skilled in the art will appreciate that various modifications, additions and substitutions are possible, without departing from the scope and spirit of the invention as disclosed in the accompanying claims.

What is claimed is:

1. A chip stack package comprising:
   a printed circuit board having a bond finger on its upper surface and a ball land on its lower surface;
   at least two face-up type semiconductor chips stacked on the printed circuit board,
   wherein each semiconductor chip comprises a plurality of bonding pads;
   one or more dummy pattern dies, each of which is attached to an upper surface of each semiconductor chip, and each of which has a circuit pattern on its lower surface and has a via pattern on its upper surface,
   wherein the circuit pattern on its lower surface is electrically connected to the semiconductor chip, and the via pattern on its upper surface is connected to the circuit pattern on its lower surface;
   a plurality of first solder balls for electrically connecting the bond finger of the printed circuit board with the circuit pattern of the lowest one of the stacked dummy pattern dies on the printed circuit board, while each of the other solder balls electrically connecting the via pattern of the lower stacked dummy pattern die to the circuit pattern of the upper stacked dummy pattern die; and
   second solder balls attached to the ball land of the printed circuit board.

2. The chip stack package of claim 1, further comprising a bump between the semiconductor chip and the dummy pattern die for electrically and mechanically connecting the semiconductor chip and the dummy pattern die.

3. The chip stack package of claim 1, wherein the dummy pattern die is attached to the semiconductor chip while exposing the center portion of the upper surface of the semiconductor chip.

4. The chip stack package of claim 3, further comprising a gap-fill material filled in space formed between two stacked semiconductor chips by using the dummy pattern die.

5. The chip stack package of claim 1, wherein the semiconductor chip is formed with a redistribution layer connected to the bonding pad.

* * * * *